United States Patent
Oh et al.

(10) Patent No.: US 11,682,687 B2
(45) Date of Patent: Jun. 20, 2023

(54) IMAGE SENSING DEVICE

(71) Applicant: SK hynix Inc., Icheon-si (KR)

(72) Inventors: Sun Ho Oh, Icheon-si (KR); Sung Kun Park, Icheon-si (KR); Kyoung In Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 253 days.

(21) Appl. No.: 17/092,738

(22) Filed: Nov. 9, 2020

(65) Prior Publication Data
US 2021/0358980 A1    Nov. 18, 2021

(30) Foreign Application Priority Data
May 13, 2020 (KR) .......................... 10-2020-0057387

(51) Int. Cl.
  *H01L 27/146*    (2006.01)
  *H01L 27/148*    (2006.01)

(52) U.S. Cl.
  CPC .... *H01L 27/1463* (2013.01); *H01L 27/14612* (2013.01); *H01L 27/14831* (2013.01); *H01L 27/14603* (2013.01); *H01L 27/14605* (2013.01); *H01L 27/14614* (2013.01); *H01L 27/14616* (2013.01); *H01L 27/14641* (2013.01); *H01L 27/14643* (2013.01)

(58) Field of Classification Search
  CPC ........... H01L 27/1463; H01L 27/14612; H01L 27/14616; H01L 27/14641; H01L 27/14614; H01L 27/14605; H01L 27/14643; H01L 27/14603; H01L 27/14831
  See application file for complete search history.

(56) References Cited

U.S. PATENT DOCUMENTS 8,614,759 B2 * 12/2013 Watanabe ......... H01L 27/14647
                                                              348/308

FOREIGN PATENT DOCUMENTS

| JP | 4696596 B2 * | 6/2011 |
| KR | 2018-0038148 A | 4/2018 |
| KR | 2018-0080469 A | 7/2018 |

* cited by examiner

*Primary Examiner* — David A Zarneke
(74) *Attorney, Agent, or Firm* — Perkins Coie LLP

(57) ABSTRACT

An image sensing device includes a pixel array including a plurality of unit pixels consecutively arranged and structured to generate an electrical signal in response to incident light by performing photoelectric conversion of the incident light. The unit pixels are isolated from each other by first device isolation structures. Each of the unit pixels includes a photoelectric conversion element structured to generate photocharges by performing photoelectric conversion of the incident light, a floating diffusion region structured to receive the photocharges, a transfer transistor structured to transfer the photocharges generated by the photoelectric conversion element to the floating diffusion region, and a well tap region structured to apply a bias voltage to a well region. The well tap region is disposed at a center portion of a corresponding unit pixel.

12 Claims, 8 Drawing Sheets

IMAGE SENSING DEVICE

CROSS-REFERENCE TO RELATED APPLICATION

This patent document claims the priority and benefits of Korean patent application No. 10-2020-0057387, filed on May 13, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

Image sensing devices may be broadly classified into CCD (charge coupled device)-based image sensors and CMOS (complementary metal oxide semiconductor)-based image sensors. The CMOS image sensors are smaller in size and consume less power than the CCD image sensors. The CMOS image sensors and other signal processing circuitry may be integrated into a single chip and may be miniaturized because CMOS sensors are fabricated using the CMOS fabrication technology. In addition, the CMOS image sensor has lower power consumption in battery powered devices than CCDs. For these reasons, the CMOS image sensors dominate in many consumer goods such as smartphones.

In addition, as the market requires higher image resolution, the number of pixels increases. As the total number of pixels on an image sensor increases, the pixel size gets smaller to avoid increasing the chip size.

SUMMARY

This patent document provides, among others, designs of image sensing devices including pixel transistors with a highly efficient layout to maximize operational efficiencies.

In an embodiment of the disclosed technology, an image sensing device may include a pixel array including a plurality of unit pixels consecutively arranged and structured to generate an electrical signal in response to incident light by performing photoelectric conversion of the incident light. The unit pixels may be isolated from each other by first device isolation structures. Each of the unit pixels may include a photoelectric conversion element structured to generate photocharges by performing photoelectric conversion of the incident light, a floating diffusion region structured to receive the photocharges, a transfer transistor structured to transfer the photocharges generated by the photoelectric conversion element to the floating diffusion region, and a well tap region structured to apply a bias voltage to a well region. The well tap region may be disposed at a center portion of a corresponding unit pixel.

In another embodiment of the disclosed technology, an image sensing device may include a plurality of unit pixel groups consecutively arranged in a first direction and a second direction perpendicular to the first direction. Each of the unit pixel groups may include first to fourth unit pixels adjacent to each other. Each of the first to fourth unit pixels may include a plurality of active regions divided by a device isolation structure. The active regions in the first to third unit pixels may be arranged to have the same structure. The active regions in the fourth unit pixel may be arranged in a different structure from the active regions of the first to third unit pixels.

In another embodiment of the disclosed technology, an image sensing device may include a first unit pixel including a first photoelectric conversion element, a first floating diffusion region, a first transfer transistor, a first source follower transistor, and a first selection transistor, a second unit pixel including a second photoelectric conversion element, a second floating diffusion region, a second transfer transistor, a second source follower transistor, and a second selection transistor, a third unit pixel including a third photoelectric conversion element, a third floating diffusion region, a third transfer transistor, a third source follower transistor, and a third selection transistor, a fourth unit pixel including a fourth photoelectric conversion element, a fourth floating diffusion region, a fourth transfer transistor, and a reset transistor, a fifth unit pixel including a fifth photoelectric conversion element, a fifth floating diffusion region, a fifth transfer transistor, a fifth source follower transistor, and a fifth selection transistor, and a sixth unit pixel including a sixth photoelectric conversion element, a sixth floating diffusion region, a sixth transfer transistor, a sixth source follower transistor, and a sixth selection transistor. The first to sixth unit pixels may be isolated from each other by a device isolation structure. The first to fourth floating diffusion regions may be coupled to a common floating diffusion node through a conductive line. The common floating diffusion node may be coupled to gates of the third, fifth, and sixth source follower transistors through a conductive line.

In another embodiment of the disclosed technology, an image sensing device may include a pixel array in which a plurality of unit pixels configured to generate an electrical signal corresponding to incident light by performing photoelectric conversion of the incident light is consecutively arranged. The plurality of unit pixels may be isolated from each other by a first device isolation structure. Each of the unit pixels may include a photoelectric conversion element configured to generate photocharges by performing photoelectric conversion of the incident light, a floating diffusion (FD) region configured to receive the photocharges, a transfer transistor configured to transmit the photocharges generated by the photoelectric conversion element to the floating diffusion (FD) region, and a well tap region configured to apply a bias voltage to a well region. The well tap region may be disposed at a center portion of a corresponding unit pixel.

In another embodiment of the disclosed technology, an image sensing device may include a plurality of unit pixel groups consecutively arranged in a first direction and a second direction perpendicular to the first direction. Each of the unit pixel groups may include first to fourth unit pixels that are arranged contiguous or adjacent to each other. Each of the first to fourth unit pixels may include a plurality of active regions defined by a device isolation structure. The active regions in the first to third unit pixels may be arranged to have the same structure. The active regions in the fourth unit pixel may be arranged in a different structure from the active regions of the first to third unit pixels.

In another embodiment of the disclosed technology, an image sensing device may include a first unit pixel including a first photoelectric conversion element, a first floating diffusion region, a first transfer transistor, a first source follower transistor, and a first selection transistor, a second unit pixel including a second photoelectric conversion element, a second floating diffusion region, a second transfer transistor, a second source follower transistor, and a second selection transistor, a third unit pixel including a third photoelectric conversion element, a third floating diffusion region, a third transfer transistor, a third source follower transistor, and a third selection transistor, a fourth unit pixel including a fourth photoelectric conversion element, a fourth floating diffusion region, a fourth transfer transistor, and a reset transistor, a fifth unit pixel including a fifth photoelectric conversion element, a fifth floating diffusion region, a fifth transfer transistor, a fifth source follower transistor, and a fifth selection transistor, and a sixth unit pixel including a sixth photoelectric conversion element, a sixth floating diffusion region, a sixth transfer transistor, a sixth source follower transistor, and a sixth selection transistor. The first to sixth unit pixels may be isolated from each other by a device isolation structure. The first to fourth floating diffusion regions may be coupled to a common floating diffusion node through a conductive line. The common floating diffusion node may be coupled to gates of the third, fifth, and sixth source follower transistors through a conductive line.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device that includes pixel transistors in each unit pixel and a connection structure of the unit pixels with a highly efficient layout to maximize operational efficiencies. The image sensing device based on some implementations can improve operational characteristics and noise characteristics, and can maintain well tap regions at a stable voltage level.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
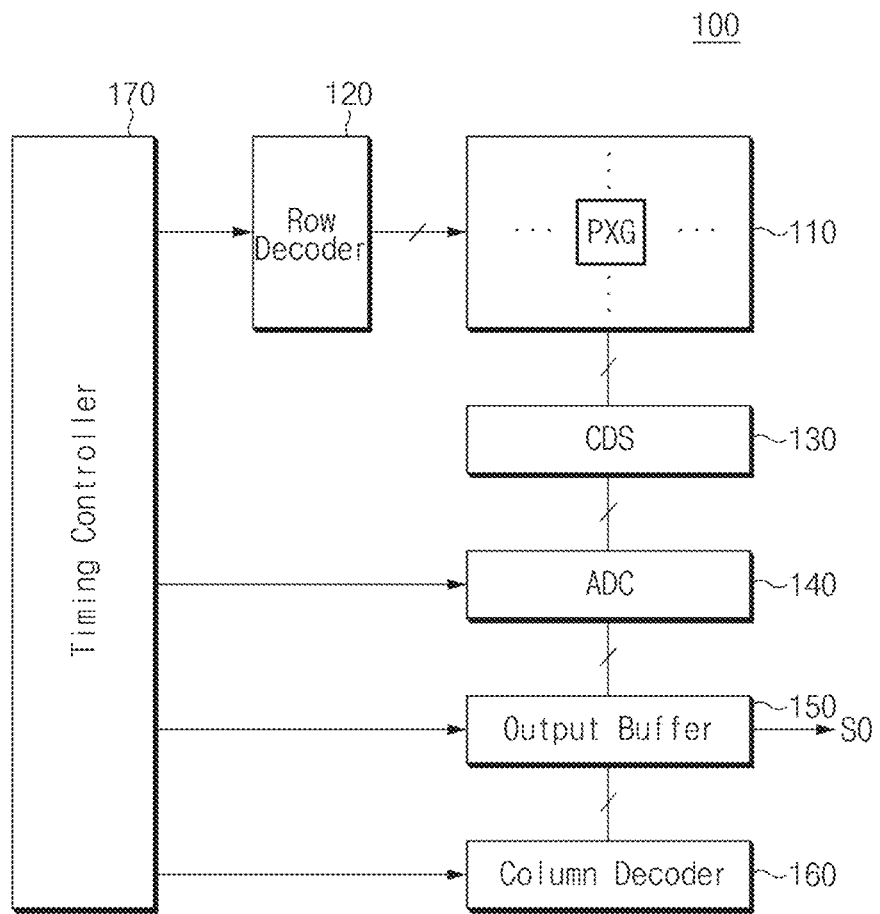
FIG. 1 is a block diagram illustrating an example of an image sensing device based on some implementations of the disclosed technology.

FIG. 1 is a block diagram illustrating an example of an image sensor based on some implementations of the disclosed technology.

In some implementations, the image sensor 100 may include a pixel array 110, a row decoder 120, a correlated double sampler (CDS) circuit 130, an analog-to-digital converter (ADC) circuit 140, an output buffer 150, a column decoder 160, and a timing controller 170. In this case, the above-mentioned constituent elements of the image sensing device 100 are disclosed only for illustrative purposes, and at least some elements may be added to or omitted from the image sensing device 100 as necessary.

The pixel array 110 may include a plurality of unit pixel groups PXGs consecutively and repeatedly arranged in a matrix-like array with a plurality of rows and columns. Each unit pixel group PXG may include a plurality of unit pixels that converts incident light into an electrical signal. For example, each unit pixel group PXG may include four adjacent unit pixels that are arranged in a (2×2) matrix array. Each unit pixel may include a photosensing pixel to generate photocharges by converting incident light into an electrical signal. Each unit pixel may include a photoelectric conversion element (also called a photoelectric conversion region) to generate photocharges through photoelectric conversion of the incident light, and a floating diffusion region that receives the photocharges generated by the photoelectric conversion element and temporarily stores the received photocharges. The floating diffusion regions in the unit pixel group PXG may be coupled to each other through conductive lines. The floating diffusion regions may be shared by unit pixels in the unit pixel group PXG through the conductive lines. Each of the unit pixels may receive control signals including a selection signal, a reset signal and a transmission signal from the row decoder 120 through row lines, and may be operated based on the control signals.

The row decoder 120 may enable the pixel array 110 upon receiving a control signal from the timing controller 170. In some implementations, the row decoder 120 may select at least one row line from among a plurality of row lines of the pixel array 110. In order to select at least one row line from among the plurality of row lines, the row decoder 120 may generate a row selection signal. The row decoder 120 may sequentially enable the pixel reset signal and the transmission signal for pixels corresponding to the at least one selected row line. Therefore, an analog reference signal and an analog image signal may be generated by each of the pixels in the selected row line and sequentially transferred to the correlated double sampler (CDS) circuit 130. In the context of this patent document, the word "pixel signal" can be used to indicate both the reference signal and the image signal generated by each pixel.

CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) circuit 130 may sequentially sample and hold the reference signal and the image signal that are transferred from the pixel array 110 to the plurality of column lines. That is, the correlated double sampler (CDS) circuit 130 may sample and hold voltage levels of the reference signal and the image signal corresponding to each column of the pixel array 110.

The correlated double sampler (CDS) circuit 130 may transmit a correlated double sampling (CDS) signal corresponding to the reference signal and the image signal for each column to the ADC circuit 140 upon receiving a control signal from the timing controller 170.

The ADC 140 is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC circuit 140 may receive the CDS signal for each column from the CDS circuit 130, may convert the received CDS signal into a digital signal, and may thus output the digital signal. In some implementations, the ADC 140 samples an input signal (e.g., pixel signal) multiple times using the reference signal and analog-to-digital convert the sampled input signals by counting the number of clock pulses until crossing points. The ADC circuit 140 may perform counting and calculation operations based on the CDS signal for each column and a ramp signal received from the timing controller 170, such that the ADC circuit 140 may generate digital image data from which noise (e.g., unique reset noise for each pixel) corresponding to each column is removed.

The ADC circuit 140 may include a plurality of column counters corresponding to respective columns of the pixel array 110, and may convert the CDS signal for each column into a digital signal using the column counters. In another embodiment, the ADC circuit 140 may include a single global counter, and may convert a CDS signal corresponding to each column into a digital signal using a global code received from the global counter.

The output buffer 150 may receive image data for each column received from the ADC circuit 140. In addition, the output buffer 150 may capture the received image data, and may output the captured image data. The output buffer 150 may temporarily store image data that is output from the ADC circuit 140 upon receiving a control signal from the timing controller 170. The output buffer 150 may operate as an interface configured to compensate for data rate difference or transmission speed difference between the image sensor 100 and another device coupled to the image sensor 100.

The column decoder 160 may select a column of the output buffer 150 upon receiving a control signal from the timing controller 170, and may sequentially output the temporarily stored image data to the selected column of the output buffer 150. In some implementations, the column decoder 160 may receive an address signal from the timing controller 170, may generate a column selection signal based on the received address signal, and may select a column of the output buffer 150 to output image data as an output signal S0 from the selected column of the output buffer 150.

The timing controller 170 may control the row decoder 120, the ADC circuit 140, the output buffer 150, and the column decoder 160.

The timing controller 170 may transmit a clock signal for operating or synchronizing the constituent elements of the image sensor 100, a control signal for timing control, and address signals needed for selection of a row or column to the row decoder 120, the column decoder 160, the ADC circuit 140, and the output buffer 150. In accordance with the embodiment, the timing controller 170 may include, for example, a logic control circuit, a phase locked loop (PLL) circuit, a timing control circuit, and a communication interface circuit.

Figure 2:
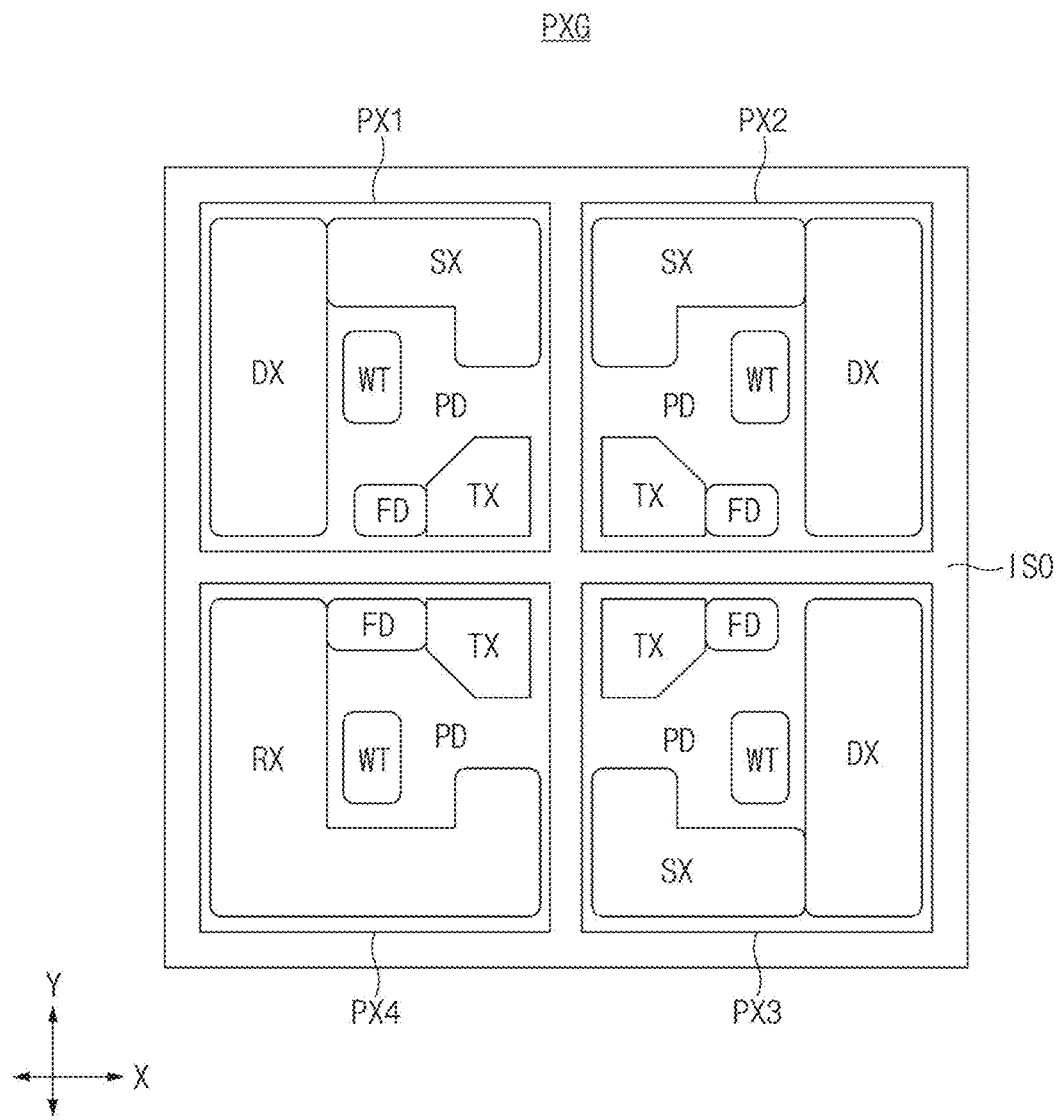
FIG. 2 is a diagram illustrating an example layout of a unit pixel group shown in FIG. 2 based on some implementations of the disclosed technology.

FIG. 2 is a diagram illustrating an example layout of the unit pixel group (PXG) shown in FIG. 1 based on some implementations of the disclosed technology.

In some implementations, each unit pixel group (PXG) may include 4 unit pixels PX1-PX4. The unit pixels PX1-PX4 may be adjacent to each other in a first direction (X-axis direction) and a second direction (Y-axis direction) perpendicular to the first direction. For example, the unit pixels PX1-PX4 may be arranged in a (2×2) matrix structure.

Each of the unit pixels PX1-PX4 may be isolated from other adjacent pixels by a device isolation structure ISO. In some implementations, each of the unit pixels PX1-PX4 includes its own photoelectric conversion element PD, floating diffusion region FD, pixel transistors TX, DX, SX, and RX, and a well tap region WT, and does not share these elements with other unit pixels. In one example, a photoelectric conversion element PD, a floating diffusion region FD, or a transistor are arranged within an area corresponding to a single unit pixel and cannot be formed across two or more unit pixels.

In some implementations, the device isolation structure ISO may include an impurity-doped isolation structure formed by implanting high-density P-type impurities (e.g., boron) into a substrate, or may include a trench isolation structure formed by etching a substrate to a predetermined depth and filling the etched region with an insulation material. Here, the trench-shaped isolation structure may include a deep trench isolation (DTI) structure, or a combination structure of the DTI structure and a shallow trench isolation (STI) structure.

In some implementations, different unit pixels may be electrically connected through conductive lines (e.g., metal lines) formed over the substrate.

Each of the unit pixels PX1-PX4 may include a back side illumination (BSI) structure or a front side illumination (FSI) structure.

In some implementations, three unit pixels PX1, PX2, and PX3 from among four unit pixels PX1-PX4 in the unit pixel group PXG may be formed to have the same structure, and the remaining one unit pixel PX4 may be different in structure from the unit pixels PX1, PX2, and PX3. For example, each of the unit pixels PX1, PX2, and PX3 may include a single photoelectric conversion element PD, a single floating diffusion region FD, a single well tap region WT, a single transfer transistor TX, a single source follower transistor DX, and a single selection transistor SX. The unit pixel PX4 may include a single photoelectric conversion element PD, a single floating diffusion region FD, a single well tap region WT, a single transfer transistor TX, and a single reset transistor RX.

In some implementations, each of the unit pixels PX1-PX4 includes a well tap region WT for applying a bias voltage to a well region at the center portion of the corresponding unit pixel. In one example, the well region may be formed in a substrate of the unit pixels PX1-PX4. In some implementations, the well region may be used as a region in which channels of the transistors TX, DX, SX, and RX are formed, and may include P-type impurities. In some implementations, a well tap can indicate an impurity-doped region that is structured to connected to the well region to apply a bias voltage to the well region. As described above, since the well tap region WT is disposed at the center portion of each pixel, a voltage at the well can be distributed equally across the pixel.

In each of the unit pixels PX1-PX4, pixel transistors may be formed to surround the well tap region WT. For example, in the unit pixels PX1, PX2, and PX3, the transfer transistor TX, the source follower transistor DX, and the selection transistor SX may be disposed in the edge region of the corresponding unit pixel by forming the well tap region WT in a well region at the center of the unit pixel. When the pixel transistors are disposed in the edge region of the unit pixel, each of the pixel transistors can increase in size, improving noise robustness of pixel transistors. Similarly, in the unit pixel PX4, the transfer transistor TX and the reset transistor RX formed to surround the well tap region WT may be disposed in the edge region of the unit pixel PX4.

In some implementations, the transfer transistors TXs of the unit pixels PX1-PX4 may be arranged at the center portion of the corresponding unit pixel group PXG as shown in FIG. 2. In this way, a mask pattern for an implantation process of the transfer transistors TXs can be simplified.

Although the floating diffusion region FD and the transfer transistor TX are shown in FIG. 2 as being separately formed, in some implementations, the photoelectric conversion element PD and the floating diffusion region FD may be formed as the source/drain region of the transfer transistor TX, and thus the floating diffusion region FD may be used as a portion of the transfer transistor TX. The photoelectric conversion element PD may be formed below the pixel transistors TX, DX, SX, and RX in a manner that the photoelectric conversion element PD vertically overlaps with the pixel transistors TX, DX, SX, and RX within the substrate of each unit pixel PX1-PX4.

In some implementations, the transfer transistors TX, the source follower transistors DX, the selection transistors SX, the floating diffusion regions FD, and the well tap regions WT of the unit pixels PX1, PX2, and PX3 may be symmetrical about the center of the unit pixel group PXG, respectively. In some implementations, the transfer transistors TX, the source follower transistors DX, the selection transistors SX, the floating diffusion regions FD, and the well tap regions WT of the unit pixels PX1 and PX2 adjacent to each other in a first direction may be arranged symmetrical to each other, respectively, with respect to a boundary region between the unit pixels PX1 and PX2. In addition, the transfer transistors TX, the source follower transistors DX, the selection transistors SX, the floating diffusion regions FD, and the well tap regions WT of the unit pixels PX2 and PX3 adjacent to each other in a second direction may be arranged symmetrical to each other, respectively, with respect to a boundary region between the unit pixels PX2 and PX3.

Although FIG. 2 shows the reset transistor RX as being formed in the unit pixel PX4 by way of example, the reset transistor RX may be formed in any of four unit pixels PX1-PX4 in the unit pixel group PXG.

Figure 3A:
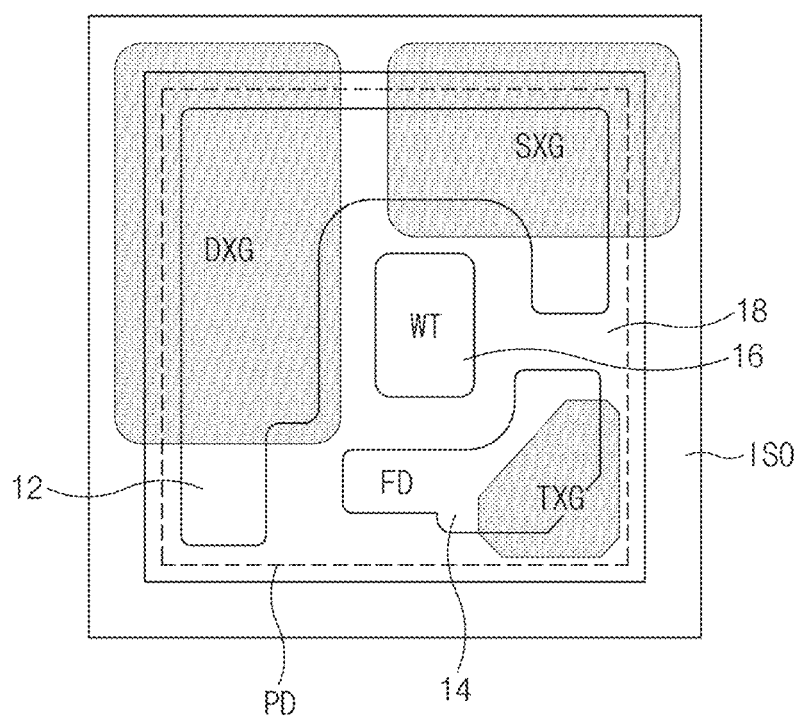
FIG. 3A is a diagram illustrating an example layout of unit pixels PX1, PX2, and PX3 in the unit pixel group shown in FIG. 2 based on some implementations of the disclosed technology.
Figure 3B:
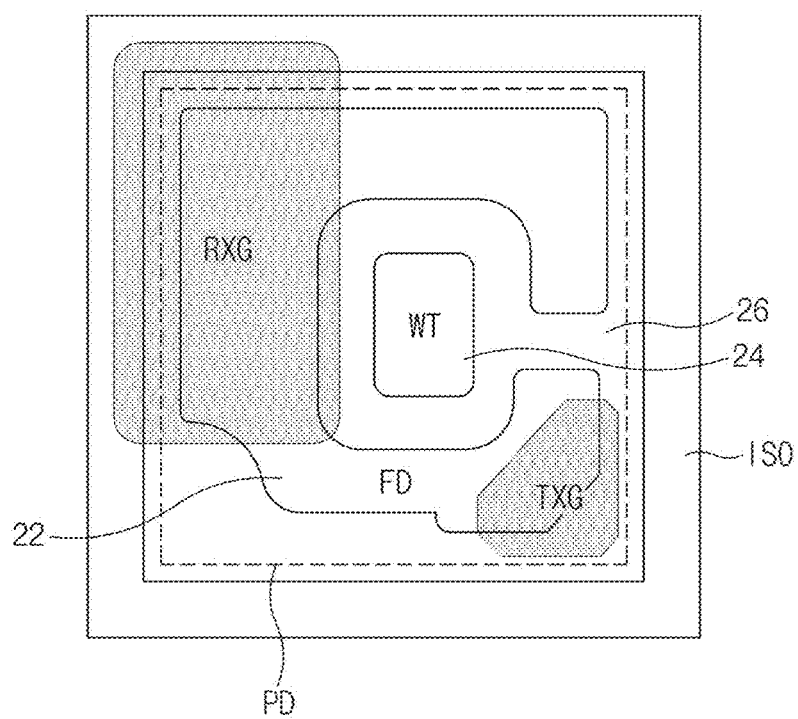
FIG. 3B is a diagram illustrating an example layout of a unit pixel PX4 in the unit pixel group shown in FIG. 2 based on some implementations of the disclosed technology.

FIG. 3A is a diagram illustrating an example layout of unit pixels PX1, PX2, and PX3 in the unit pixel group PXG shown in FIG. 2. FIG. 3B is a diagram illustrating an example layout of the unit pixel PX4 in the unit pixel group PXG shown in FIG. 2.

Referring to FIG. 3A, each of the unit pixels PX1, PX2, and PX3 may include a device isolation structure 18 formed to define active regions 12, 14, and 16. The active regions 12, 14, and 16 may be formed in the well region. The device isolation structure 18 may include an impurity-doped isolation structure or a trench-shaped isolation structure. In some implementations, the impurity-doped isolation structure may be formed by implanting high-density P-type impurities (e.g., boron) into the substrate of each of the unit pixels PX1, PX2, and PX3 to a predetermined depth, and the trench-shaped isolation structure may be formed by etching the substrate to a predetermined depth and filling the etched region with an insulation material. The trench-shaped isolation structure may include a shallow trench isolation (STI) structure.

A gate DXG of the source follower transistor DX and a gate SXG of the selection transistor SX may be formed over the active region 12 while being spaced apart from each other by a predetermined distance. For example, the source follower transistor DX and the selection transistor SX may be formed to share only one active region 12, and may be coupled in series to each other.

A gate TXG of the transfer transistor TX may be formed over the active region 14, and a floating diffusion region FD may be formed at one side of the transfer gate TXG in the active region 14. In some implementations, the transfer gate TXG may be formed at a predetermined depth in the substrate. In one example, the transfer gate TXG may be formed in a recess gate shape that forms a vertical channel region between the photoelectric conversion element PD and the floating diffusion region FD in response to a transmission signal.

The active region 16 may include a well tap region WT for applying a bias voltage to the well region of each of the unit pixels PX1, PX2, and PX3. The well tap region WT may include P-type impurities (P$^+$).

The active region 16 may be disposed at the center portion of each of the unit pixels PX1, PX2, and PX3. The active regions 12 and 14 may be formed to surround the active region 16 at least in part in the edge region of the unit pixels PX1, PX2, and PX3. For example, the active regions 12 and 14 may be formed, in combination, to surround the active region 16 while having a donut shape with openings at two places (i.e., boundary regions of the active regions 12 and 14). In other words, the active regions 12 and 14 are formed to, at least in part, surround the active region 16, but the active regions 12 and 14 are isolated from each other.

In the unit pixel group PXG, the active regions 12, 14, and 16 of the unit pixels PX1, PX2, and PX3 are arranged symmetrical to each other with respect to a boundary region of the unit pixels, the active regions 12, 14, and 16 can have the same structure in each of the unit pixels PX1, PX2, and PX3, respectively. Although FIG. 3A illustrates only one configuration for the unit pixels PX1, PX2, and PX3, it can be readily understood, from FIG. 2, that the active regions 12, 14, and 16 of one of the unit pixels PX1, PX2, and PX3 can be symmetrical to the active regions 12, 14, and 16 of the others of the unit pixels PX1, PX2, and PX3.

For example, the active region 16 including the well tap region WT may be disposed at the center portion of each of the unit pixels PX1, PX2, and PX3. In the unit pixels PX1, PX2, and PX3, the active regions 16 in one of the unit pixels PX1, PX2, and PX3 may be formed to have the same shape symmetrical to the active regions 16 in the others of the unit pixels PX1, PX2, and PX3. In addition, two transistors DX and SX may be formed in a single active region 12. In the unit pixels PX1, PX2, and PX3, the active regions 12 in one of the unit pixels PX1, PX2, and PX3 may be formed to have the same shape symmetrical to the active regions 12 in the others of the unit pixels PX1, PX2, and PX3. In addition, the transistor TX may be formed in a single active region 14 isolated from the active regions 12 and 16. In the unit pixels PX1, PX2, and PX3, the active regions 14 in one of the unit pixels PX1, PX2, and PX3 may be formed to have the same shape symmetrical to the active regions 14 in the others of the unit pixels PX1, PX2, and PX3. As described above, in the unit pixels PX1, PX2, and PX3, the active regions 12, 14, and 16 may be arranged to have the same structure. The photoelectric conversion element PD may be formed below the active regions 12, 14, and 16 in a manner that the photoelectric conversion element PD can vertically overlap with the active regions 12, 14, and 16 in the substrate of each of the unit pixels PX1, PX2, and PX3.

In the context of this patent document, the terms "same shape" and "same structure" can be used to indicate different shapes or structures that are symmetrical to each other.

Referring to FIG. 3B, the unit pixel PX4 may include a device isolation structure 26 formed to define the active regions 22 and 24. The device isolation structure 26 may include a shallow trench isolation (STI) structure.

A gate RXG of the reset transistor RX and a gate TXG of the transfer transistor TX may be formed, at least in part, over the active region 22 while being spaced apart from each other by a predetermined distance. For example, the reset transistor RX and the transfer transistor TX may be formed to share only one active region 22 in any one PX4 of unit pixels, and may thus be coupled in series to each other. In the active region 22, the floating diffusion region FD may be formed between the gates RXG and TXG.

In some implementations, the gate RXG of the reset transistor RX may be formed to have the same size as the gate DXG of the source follower transistor DX in the unit pixels PX1, PX2, and PX3.

The well tap region WT for applying a bias voltage to the well region of the unit pixel PX4 may be formed in the active region 24. The active region 24 may be formed to have the same shape as the active region 16 of each of the unit pixels PX1, PX2, and PX3.

The active region 24 may be disposed at the center portion of the unit pixel PX4, and the active region 22 may be formed in the edge region of the unit pixel PX4 and, at least in part, surround the active region 26. For example, the active region 22 may be formed in a donut-shape with an opening to surround the active region 24.

Figure 4:
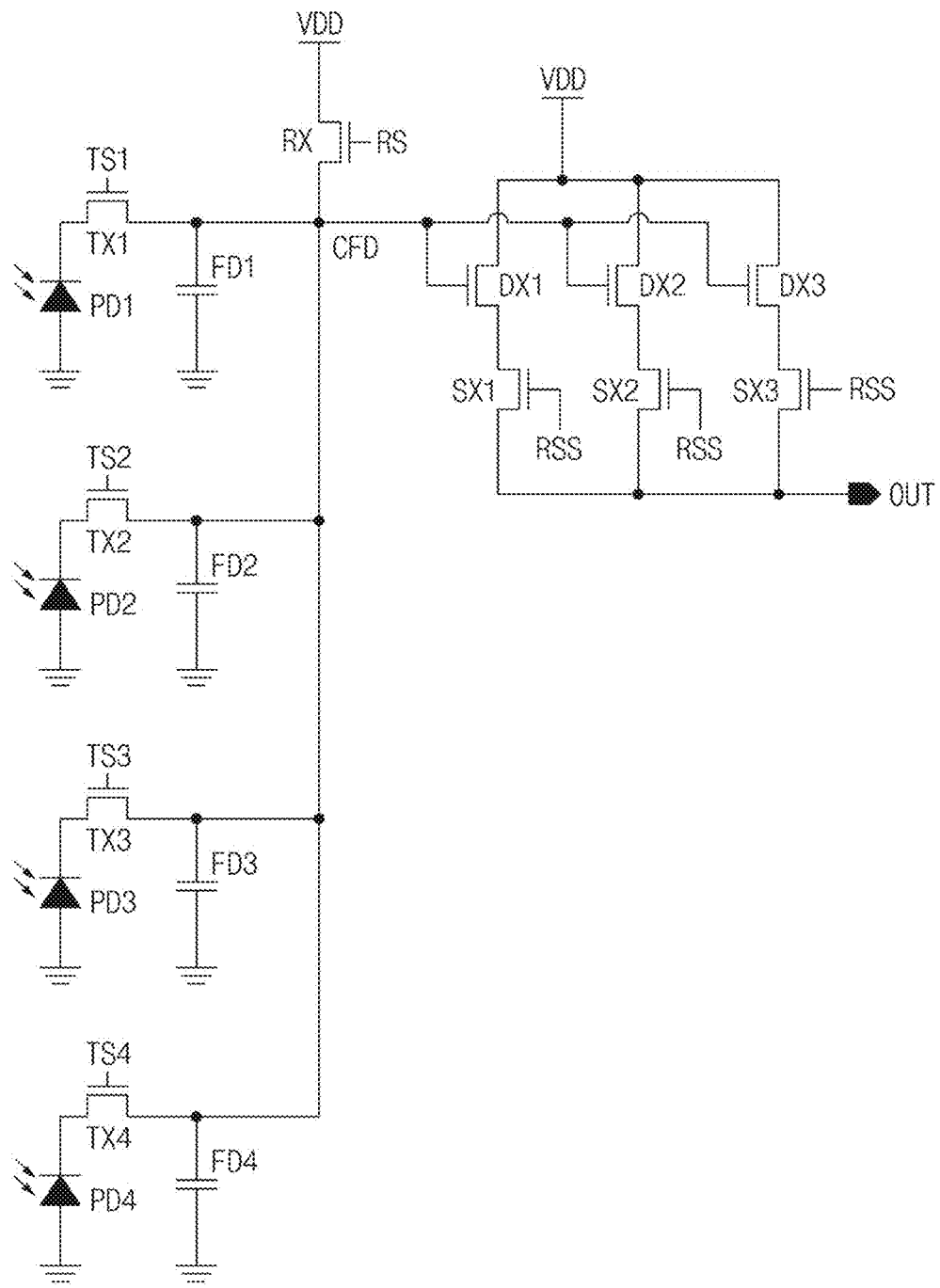
FIG. 4 is a diagram illustrating an example of an equivalent circuit corresponding to a 4-shared pixel structure based on some implementations of the disclosed technology.

FIG. 4 is a diagram illustrating an example of an equivalent circuit corresponding to a 4-shared pixel structure based on some implementations of the disclosed technology. For convenience of description, a circuit configuration that includes circuit blocks sharing at least one common circuit element as illustrated in FIG. 4 will hereinafter be referred to as a shared circuit.

In some implementations, the shared circuit may include photoelectric conversion elements PD1-PD4, floating diffusion regions FD1-FD4, transfer transistors TX1-TX4, source follower transistors DX1-DX3, selection transistors SX1-SX3, and a reset transistor RX.

Each of the photoelectric conversion elements PD1-PD4 may perform photoelectric conversion of incident light to generate photocharges corresponding to the amount of photons of incident light. Each of the photoelectric conversion elements PD1-PD4 may be implemented as a photodiode, a phototransistor, a photogate, a pinned photodiode, or a combination thereof.

The transfer transistors TX1-TX4 may be coupled to the photoelectric conversion elements PD1-PD4 and the floating diffusion regions FD1-FD4. For example, the transfer transistor TX1 may be coupled to the photoelectric conversion element PD1 and the floating diffusion region FD1, the transfer transistor TX2 may be coupled to the photoelectric conversion element PD2 and the floating diffusion region FD2, the transfer transistor TX3 may be coupled to the photoelectric conversion element PD3 and the floating diffusion region FD3, and the transfer transistor TX4 may be coupled to the photoelectric conversion element PD4 and the floating diffusion region FD4. That is, one terminal of each transfer transistor TX1-TX4 may be coupled to the photoelectric conversion element PD1-PD4 in the same unit pixel, and the other terminal of each transfer transistor TX1-TX4 may be coupled to the floating diffusion region FD1-FD4 in the same unit pixel. In this case, the transfer transistors TX1-TX4 and the floating diffusion regions FD1-FD4 in the same unit pixel may be formed in the same active region as shown in FIG. 3A or FIG. 3B, such that the transfer transistors TX1-TX4 and the floating diffusion regions FD1-FD4 can be electrically coupled to each other. The transfer transistors TX1-TX4 may be turned on or off in response to transmission signals TS1-TS4 applied to gate terminals thereof, such that the transfer transistors TX1-TX4 may transmit photocharges generated by the photoelectric conversion elements PD1-PD4 to the corresponding floating diffusion regions FD1-FD4.

The floating diffusion regions FD1-FD4 may be electrically coupled to each other through conductive lines, and coupled in common to a common floating diffusion node CFD. The common floating diffusion node CFD may be regarded as a single junction capacitor coupled in parallel to the floating diffusion regions FD1-FD4. Capacitance of the common floating diffusion node CFD may be denoted by the sum of capacitances of the floating diffusion regions FD1-FD4. The common floating diffusion node CFD may receive photocharges of the photoelectric conversion elements PD1-PD4 through the transfer transistors TX1-TX4, and may temporarily hold the received photocharges.

The source follower transistors DX1-DX3 may be coupled to a power-supply voltage (VDD) node and the selection transistors SX1-SX3 corresponding thereto. For example, one terminal of the source follower transistor DX1 may be coupled to the power-supply voltage (VDD) node and the other terminal of the source follower transistor DX1 may be coupled to the selection transistor SX1 belonging to the same unit pixel, one terminal of the source follower transistor DX2 may be coupled to the power-supply voltage (VDD) node and the other terminal of the source follower transistor DX2 may be coupled to the selection transistor SX2 belonging to the same unit pixel, and one terminal of the source follower transistor DX3 may be coupled to the power-supply voltage (VDD) node and the other terminal of the source follower transistor DX3 may be coupled to the selection transistor SX3 belonging to the same unit pixel. In this case, the source follower transistors DX1-DX3 and the selection transistors SX1-SX3 in the same unit pixel may share the same active region as shown in FIG. 3A, such that the source follower transistors DX1-DX3 and the selection transistors SX1-SX3 can be electrically coupled to each other. The source follower transistors DX1-DX3 may be coupled to the common floating diffusion node CFD through gate terminals thereof. Therefore, the source follower transistors DX1-DX3 may generate an electrical signal corresponding to the voltage at the common floating diffusion node CFD, and may output the generated signal to the corresponding selection transistors SX1-SX3. That is, each of the source follower transistors DX1-DX3 may amplify a voltage change at the common floating diffusion node CFD, and may output the amplified voltage change to the selection transistors SX1-SX3. In some implementations, the source follower transistors DX1-DX3 may be coupled to the power-supply voltage (VDD) node in common, and may receive the same voltage from the common floating diffusion node CFD through gate terminals thereof, such that the source follower transistors DX1-DX3 may operate as a single transistor having a relatively large channel width.

The selection transistors SX1-SX3 may be respectively coupled to the source follower transistors DX1-DX3 corresponding thereto, and each of the selection transistors SX1-SX3 may be coupled to an output node OUT. For example, one terminal of the selection transistor SX1 may be coupled to the corresponding source follower transistor DX1 and the other terminal of the selection transistor SX1 may be coupled to the output node OUT, one terminal of the selection transistor SX2 may be coupled to the corresponding source follower transistor DX2 and the other terminal of the selection transistor SX2 may be coupled to the output node OUT, and one terminal of the selection transistor SX3 may be coupled to the corresponding source follower transistor DX3 and the other terminal of the selection transistor SX3 may be coupled to the output node OUT. The selection transistors SX1-SX3 may be turned on or off in response to the row selection signal (RSS) applied to gate terminals thereof, such that the selection transistors SX1-SX3 may transmit output signals of the source follower transistors DX1-DX3 to the output node OUT. The output node OUT may be coupled to column lines. In some implementations, the selection transistors SX1-SX3 may be coupled in common to the single output node OUT, and may receive the same row selection signal (RSS) through gate terminals thereof, such that the selection transistors SX1-SX3 may operate as a single transistor having a relatively large channel width.

In a shared circuit based on some implementations of the disclosed technology, an output transistor set includes a single source follower transistor (DX1, DX2, or DX3) and a single selection transistor (SX1, SX2, or SX3) may be coupled in series to each other, and three output transistor sets may be coupled in parallel between the power-supply voltage (VDD) node and the output node (OUT), with the source follower transistors (DX1, DX2, and DX3) being coupled to the common floating diffusion node CFD.

The reset transistor RX may be coupled between the power-supply voltage (VDD) node and the common floating diffusion node CFD. The reset transistor RX may be turned on or off in response to the reset signal (RS) applied to a gate terminal thereof, such that the common floating diffusion node CFD can be reset to the power-supply voltage (VDD) level.

The transmission signals TS1-TS4, the row selection signal (RSS), and the reset signal (RS) may be received from the row decoder 120.

Figure 5:
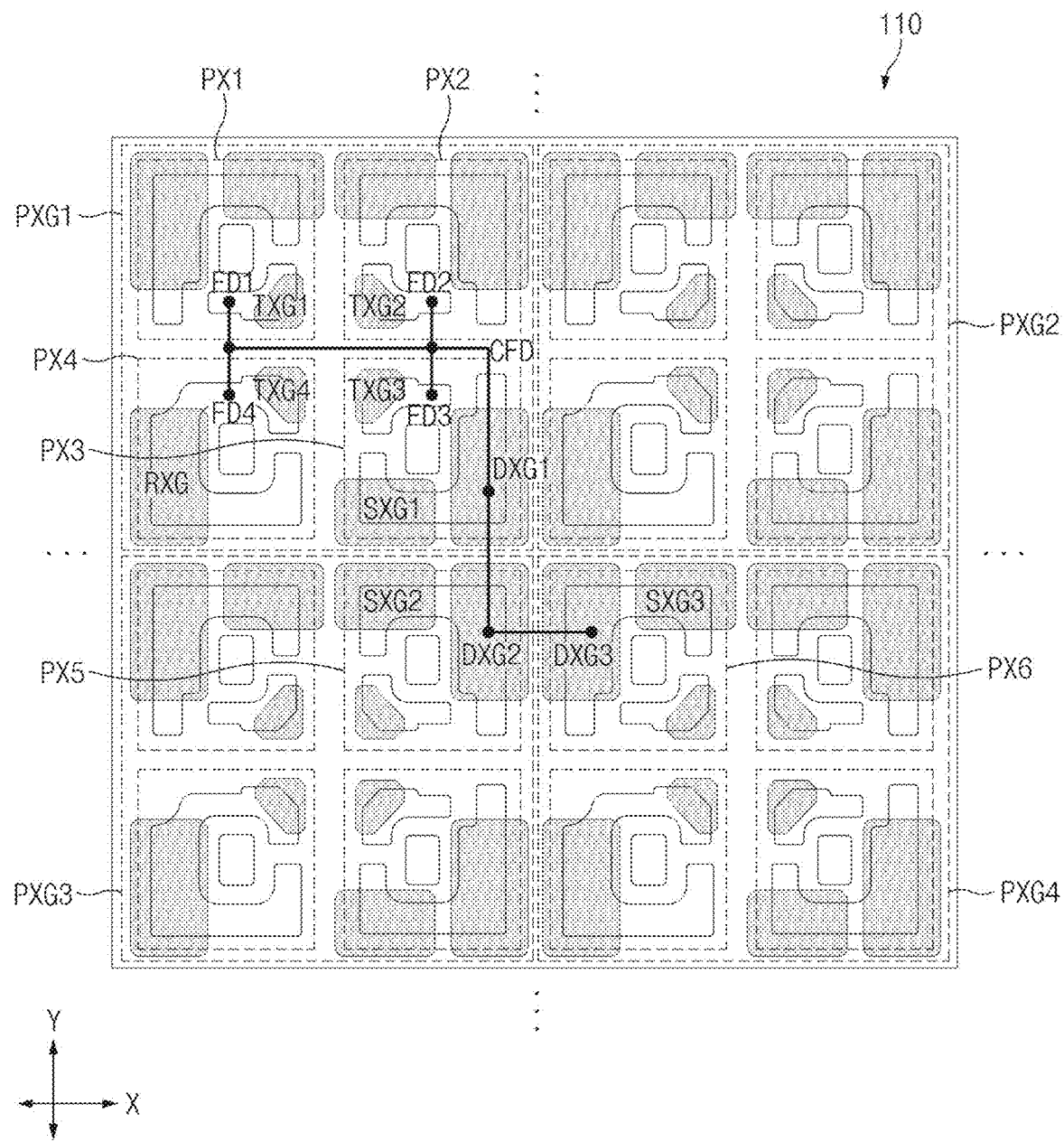
FIG. 5 is a diagram illustrating an example of a pixel array that includes a common floating diffusion node CFD to show the physical and electrical connection between the common floating diffusion node CFD and source follower transistors in the circuit diagram of FIG. 4 based on some implementations of the disclosed technology.

FIG. 5 is a diagram illustrating an example of the pixel array 110 that includes the common floating diffusion node CFD to show the physical and electrical connection between the common floating diffusion node CFD and source follower transistors in the circuit diagram of FIG. 4 based on some implementations of the disclosed technology.

In some implementations, the pixel array 110 may include a plurality of unit pixel groups PXG1-PXG4 consecutively arranged in a first direction and a second direction, and each of the unit pixel groups PXG1-PXG4 may include four unit pixels arranged in a (2×2) matrix array. The unit pixel groups PXG1-PXG4 may have the same layout. In the unit pixel group PXG1, each of the unit pixels PX1, PX2, and PX3 may have the same structure and/or layout as the unit pixel shown in FIG. 3A, and the unit pixel PX4 may have the same structure and/or layout as the unit pixel shown in FIG. 3B.

The photoelectric conversion elements, the floating diffusion regions, and the transfer transistors in the unit pixels PX1-PX4 shown in FIG. 5 may correspond to the photoelectric conversion elements PD1-PD4, the floating diffusion regions FD1-FD4, and the transfer transistors TX1-TX4 shown in FIG. 4, respectively. For example, the transfer gates TXG1-TXG4 of the unit pixels PX1-PX4 shown in FIG. 5 may respectively correspond to gates of the transfer transistors TX1-TX4 shown in FIG. 4. Gates DXG1-DXG3 and SXG1-SXG3 of the unit pixels PX3, PX5, and PX6 shown in FIG. 5 may correspond to the source follower transistors DX1-DX3 and the selection transistors SX1-SX3 shown in FIG. 4. In addition, the gate RXG of the unit pixel PX4 shown in FIG. 5 may correspond to the gate of the reset transistor RX shown in FIG. 4.

The floating diffusion regions FD1-FD4 of four unit pixels PX1-PX4 belonging to the same unit pixel group PXG1 may be electrically coupled to each other through conductive lines, forming the common floating diffusion node CFD. That is, four floating diffusion regions FD1-FD4 belonging to the same unit pixel group PXG1 may be shared with each other.

The common floating diffusion node CFD may be coupled to gates of the source follower transistors in three unit pixels. In this case, one unit pixel selected from among the three unit pixels may be a unit pixel contained in the unit pixel group PXG1 in which the floating diffusion regions FD1-FD4 are shared with each other, and the remaining two unit pixels from among the three unit pixels may be unit pixels respectively in two different unit pixel groups adjacent to the unit pixel group PXG1.

For example, the common floating diffusion node CFD may be coupled to the gate DXG1 of the source follower transistor formed in the unit pixel PX3 contained in the unit pixel group PXG1, and also coupled to the gates DXG2 and DXG3 of the source follower transistors formed in the unit pixels PX5 and PX6 respectively contained in the unit pixel groups PXG3 and PXG4 adjacent to the unit pixel group PXG1 through conductive lines. That is, in the shared circuit shown in FIG. 4, the source follower transistor DX1 and the selection transistor SX1 (i.e., a first output transistor set) may be a source follower transistor and a selection transistor formed in the unit pixel PX3 of the unit pixel group PXG1, respectively. The source follower transistor DX2 and the selection transistor SX2 (i.e., a second output transistor set) may be a source follower transistor and a selection transistor formed in the unit pixel PX5 of the unit pixel group PXG3. In addition, in the shared circuit shown in FIG. 4, the source follower transistor DX3 and the selection transistor SX3 (i.e., a third output transistor set) may be a source follower transistor and a selection transistor formed in the unit pixel PX6 of the unit pixel group PXG4, respectively.

Here, which unit pixel will use its output transistor sets as the second output transistor set or the third output transistor set may be determined based on where the first output transistor set is. For example, the second output transistor set may be an output transistor set located at a specific place that can minimize the length of the conductive line by which the gate DX1 of the first output transistor set is coupled to the gate DX2 of the second output transistor set. The third output transistor set may be an output transistor set located at a specific place that can minimize the length of the conductive line by which the gate DX2 of the second output transistor set is coupled to the gate DX3 of the third output transistor set can be minimized in length.

As shown in FIG. 5, the common floating diffusion node CFD may be coupled to the gate DXG1 of the source follower transistor formed in the unit pixel PX3. In this case, the gate of the source follower transistor located closest to the gate DXG1 may be used as the gate DXG2 of the unit pixel PX5. Therefore, the source follower transistor and the selection transistor in the unit pixel PX5 may be used as the second output transistor set.

Likewise, the gate of the source follower transistor located closest to the gate DXG2 may be used as the gate DXG3 of the unit pixel PX6. Therefore, the source follower transistor and the selection transistor in the unit pixel PX6 may be used as the third output transistor set.

Figure 6:
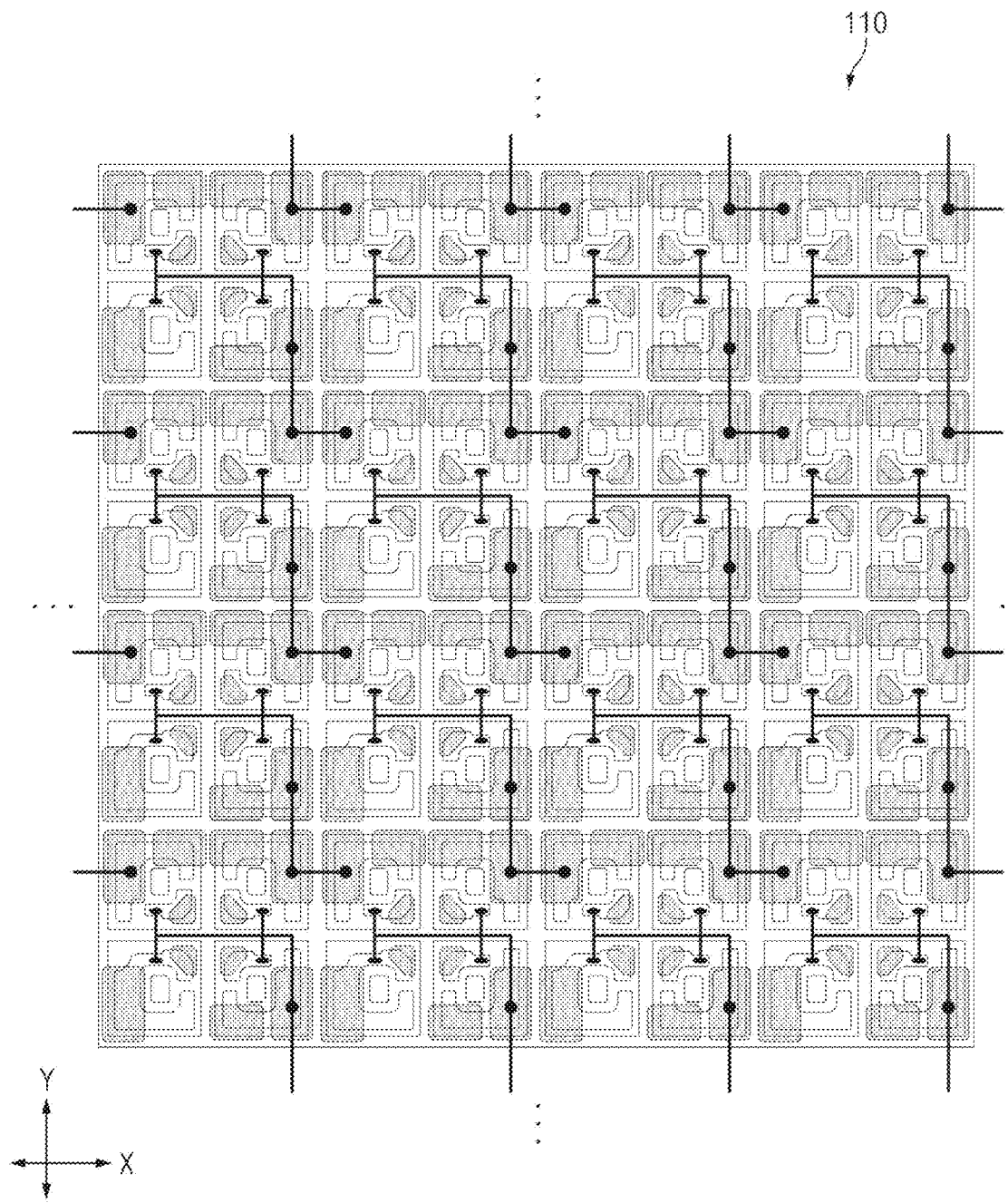
FIG. 6 is a diagram illustrating how the connection structure shown in FIG. 5 extends in a pixel array of an image sensing device based on some implementations of the disclosed technology.

FIG. 6 is a diagram illustrating how the connection structure shown in FIG. 5 extends in a pixel array of an image sensing device based on some implementations of the disclosed technology.

Although interconnects between the transfer transistors, the selection transistors, and the reset transistors are not illustrated in FIGS. 5 and 6, it can be readily understood, from the above descriptions, how the transfer transistors, the selection transistors, and the reset transistors can be coupled to each other.

Figure 7:
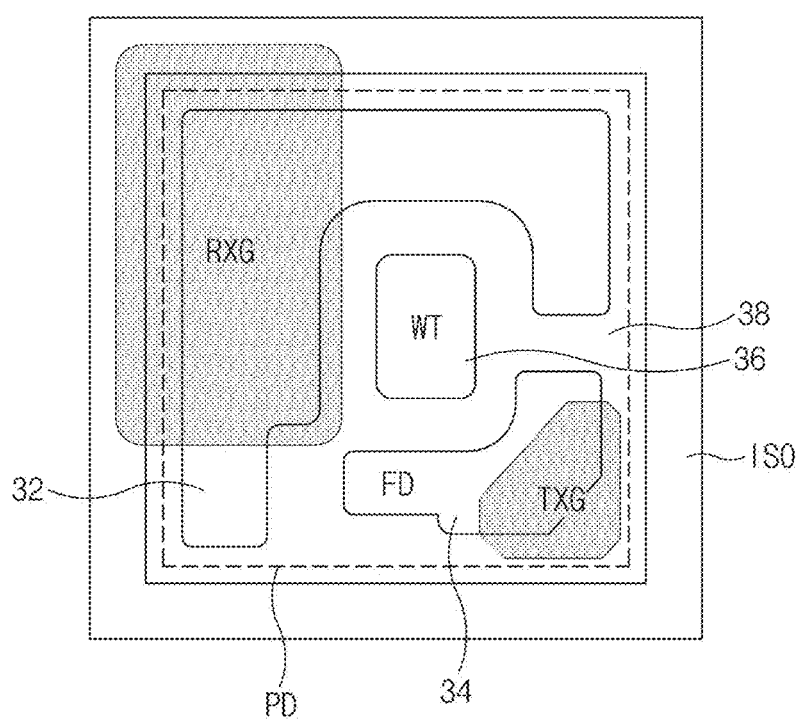
FIG. 7 is a diagram illustrating another example layout of the unit pixel PX4 in the unit pixel group shown in FIG. 2 based on some implementations of the disclosed technology.

FIG. 7 is a diagram illustrating another example layout of the unit pixel PX4 in the unit pixel group PXG shown in FIG. 2 based on some implementations of the disclosed technology.

In some implementations, the unit pixel PX4' may include a device isolation structure 38 defining the active regions 32, 34, and 36. The device isolation structure 38 may include a shallow trench isolation (STI) structure.

A gate RXG of the reset transistor RX may be formed over the active region 32. That is, the reset transistor RX may be formed in the active region 32. The gate RXG of the reset transistor may be formed to have the same size as the gate DXG of the source follower transistor DX in the unit pixels PX1, PX2, and PX3. The active region 32 of the unit pixel PX4' may be formed to have the same shape and size as the active region 12 of the unit pixels PX1, PX2, and PX3. In addition, the gate RXG is formed in the active region 32 of the unit pixel PX4' at a symmetrical location to the gate DXG formed in the active region 12 of the unit pixels PX1, PX2, and PX3.

The gate TXG of the transfer transistor TX may be formed over the active region 34, and the floating diffusion region FD may be formed at one side of the transfer gate TXG in the active region 34. The transfer gate TXG may be formed at a predetermined depth in the substrate. In one example, the transfer gate TXG may be formed in a recess gate shape that forms a vertical channel region between the photoelectric conversion element PD and the floating diffusion region FD in response to a transmission signal. The active region 34 may be formed to have the same shape and size as the active region 14 of the unit pixels PX1, PX2, and PX3.

In the active region 36, the well tap region WT for applying a bias voltage to the well region of the unit pixel PX4' may be formed. The active region 36 may be formed to have the same shape and size as the active region 16 of the unit pixels PX1, PX2, and PX3.

The active region 36 may be disposed at the center portion of the unit pixel PX4'. The active regions 32 and 34 may be formed in the edge region of the unit pixel PX4' and surround the active region 36. For example, the active regions 32, 34, and 36 of the unit pixel PX4' may be identical in structure to the active regions 12, 14, and 16 of the unit pixels PX1, PX2, and PX3. That is, as compared to the unit pixels PX1, PX2, and PX3, although only the reset transistor is formed in the active region 32 of the unit pixel PX4' differently from the unit pixels PX1, PX2, and PX3, and the remaining constituent elements other than the reset transistor formed in the active region 32 of the unit pixel PX4' may be identical to those of the unit pixels PX1, PX2, and PX3.

As is apparent from the above description, the image sensing device based on some implementations of the disclosed technology can be used to improve operational characteristics.

Specifically, the image sensing device based on some implementations of the disclosed technology can be used to improve noise characteristics, and can enable well potentials generated in each unit pixel to be uniform.

Although a number of illustrative embodiments have been described, it should be understood that modifications or variation of the disclosed embodiments and other embodiments may be made based on what is disclosed in this patent document.

What is claimed is:

1. An image sensing device comprising:
a pixel array including a plurality of unit pixels consecutively arranged and structured to generate an electrical signal in response to incident light by performing photoelectric conversion of the incident light,
wherein the unit pixels are isolated from each other by first device isolation structures, and each of the unit pixels includes:
a photoelectric conversion element structured to generate photocharges by performing photoelectric conversion of the incident light;
a floating diffusion region structured to receive the photocharges;
a transfer transistor structured to transfer the photocharges generated by the photoelectric conversion element to the floating diffusion region; and
a well tap region structured to apply a bias voltage to a well region,
wherein the well tap region is disposed at a center portion of a corresponding unit pixel.

2. The image sensing device according to claim 1, wherein the plurality of unit pixels are arranged to be grouped into a plurality of unit pixel groups that are consecutively arranged, and wherein the floating diffusion regions of the unit pixels in each of the unit pixel groups are coupled to a common floating diffusion node through a conductive line.

3. The image sensing device according to claim 2, wherein the unit pixels in each of the unit pixel groups are arranged in a 2×2 matrix array.

4. The image sensing device according to claim 2, wherein the unit pixels in each of the unit pixel groups include a plurality of first unit pixels and a second unit pixel, and wherein:
each of the first unit pixels includes a source follower transistor configured to generate an amplification signal corresponding to a voltage at the common floating diffusion node, and a selection transistor configured to output the amplification signal to an output node in response to a selection signal; and the second unit pixel includes a reset transistor configured to reset the common floating diffusion node in response to a reset signal.

5. The image sensing device according to claim 4, wherein each of the first unit pixels includes first to third active regions divided by a second device isolation structure, and wherein:
   the first active region is disposed at a center portion of the first unit pixels, and
   the second and third active regions are disposed in an edge region of the first unit pixels and surround the first active region.

6. The image sensing device according to claim 5, wherein:
   the well tap region is formed in the first active region;
   the source follower transistor and the selection transistor are formed in the second active region; and
   the transfer transistor and the floating diffusion region are formed in the third active region.

7. The image sensing device according to claim 4, wherein the second unit pixel includes fourth and fifth active regions divided by a third device isolation structure, and wherein:
   the fourth active region is disposed at a center portion of the second unit pixel; and
   the fifth active region is disposed in an edge region of the second unit pixel and surround the fourth active region.

8. The image sensing device according to claim 7, wherein:
   the fourth active region includes the well tap region; and
   the fifth active region includes the reset transistor, the transfer transistor and the floating diffusion region.

9. The image sensing device according to claim 4, wherein the second unit pixel includes sixth to eighth active regions divided by a fourth device isolation structure, and wherein:
   the sixth active region is disposed at a center portion of the second unit pixel, and
   the seventh and eighth active regions are disposed in an edge region of the second unit pixel and surround the sixth active region.

10. The image sensing device according to claim 9, wherein:
    the sixth active region includes the well tap region;
    the seventh active region includes the reset transistor; and
    the eighth active region includes the transfer transistor and the floating diffusion region.

11. The image sensing device according to claim 1, wherein the plurality of unit pixels includes first to sixth unit pixels and wherein:
    the first unit pixel includes a first source follower transistor and a first selection transistor;
    the second unit pixel includes a second source follower transistor and a second selection transistor;
    the third unit pixel further includes a third source follower transistor and a third selection transistor;
    the fourth unit pixel further includes a reset transistor;
    the fifth unit pixel further includes a fourth source follower transistor and a fourth selection transistor; and
    the sixth unit pixel further includes a fifth source follower transistor and a fifth selection transistor,
    wherein the floating diffusion regions of the first to fourth unit pixels are coupled to a common floating diffusion node through a conductive line, and the common floating diffusion node is coupled to gates of the third, fifth, and sixth source follower transistors through a conductive line.

12. The image sensing device according to claim 11, wherein:
    the first to fourth unit pixels are arranged in a 2×2 matrix array while being arranged adjacent to each other;
    the fifth unit pixel is located adjacent to the third unit pixel in a first direction; and
    the sixth unit pixel is located adjacent to the fifth unit pixel in a second direction perpendicular to the first direction.

* * * * *